United States Patent [19]

Picco

[11] Patent Number: 4,902,634
[45] Date of Patent: Feb. 20, 1990

[54] PROCESS FOR MANUFACTURING CMOS DEVICES

[75] Inventor: Paolo Picco, Monza, Italy

[73] Assignee: SGS-Thomson Microelectronics S.p.A., Catania, Italy

[21] Appl. No.: 220,652

[22] Filed: Jul. 18, 1988

[30] Foreign Application Priority Data

Jul. 28, 1987 [IT] Italy .............................. 21479 A/87

[51] Int. Cl.$^4$ .................... H01L 21/00; H01L 21/02; H01L 21/265; H01L 29/78
[52] U.S. Cl. ........................................ 437/34; 437/41; 437/56; 437/58; 148/DIG. 82; 357/42; 357/44
[58] Field of Search ...................... 437/34, 41, 56, 29, 437/58; 148/DIG. 82; 357/42, 44

[56] References Cited

FOREIGN PATENT DOCUMENTS

| | | | |
|---|---|---|---|
| 53-023577 | 3/1978 | Japan | 437/56 |
| 58-218161 | 12/1983 | Japan | 437/34 |
| 58-220461 | 12/1983 | Japan | 437/34 |
| 61-287161 | 12/1986 | Japan | 437/56 |

OTHER PUBLICATIONS

Weste, N., "Principles of CMOS VLSI Design-A Systems Perspective," pp. 76, 84, 89, 107, chapter 3, Addison-Wesley.
Wolf, S., Silicon Processing for the VLSI Era, vol. 1, Lattice Press, 1986.

Primary Examiner—Brian E. Hearn
Assistant Examiner—B. Everhart
Attorney, Agent, or Firm—Guido Modiano; Albert Josif

[57] ABSTRACT

A process for manufacturing CMOS devices is described, wherein two separate masks are used for the production of the gate regions of the two complementary transistors of the CMOS device, each of said masks allowing the formation of the gate region of only one of the two complementary transistors and being also used for the implantation of ions adapted to form the source and drain regions of said transistor. Accordingly only two masking steps are sufficient for the production of the gate, drain and source regions of the CMOS devices, with a reduction of the costs related to the production of integrated circuits executed in CMOS technology.

2 Claims, 4 Drawing Sheets

PROCESS FOR MANUFACTURING CMOS DEVICES

BACKGROUND OF THE INVENTION

The present invention relates to a process for manufacturing CMOS devices.

It is known that in recent times CMOS (Complementary Metal Oxide Semiconductor) technology is acquiring increasingly larger portions of the production of integrated circuits with respect to the competing NMOS technology. This production trend is motivated by the extremely low dissipation characteristics of CMOS circuits in static conditions, by their high switching speed, by their immunity to radiation and by their compatibility with bipolar devices.

The price to be paid to achieve these advantages consists of a greater structural complexity of CMOS devices with respect to NMOS devices and a corresponding greater complexity of their manufacturing methods. If, for example, an elementary NMOS device entails the execution of seven distinct physical layers and requires five maskings, an elementary CMOS device entails the execution of twelve layers and, with current processes, requires ten maskings. A typical process currently used for manufacturing an elementary CMOS device requires, on a substrate of a first type of conductivity, the formation of a zone of the opposite type of conductivity by means of an appropriate masking step, the definition of the active areas by means of an appropriate mask, the implantation and the diffusion of appropriate ions for the definition of the insulation regions at the junction region of two regions having opposite conductivities, and field oxidation, for the obtainment of an intermediate structure, as schematically shown in FIG. 1. As can be seen, said structure comprises a substrate 1 which defines an active region, in which a transistor with a certain type of channel is to be manufactured, and a zone 2 with opposite conductivity in which the complementary transistor is to be manufactured. The structure illustrated in FIG. 1 furthermore already comprises insulation regions 3 and 4, doped so as to have opposite conductivity, and insulating field-oxide regions 5.

Subsequently, starting from this structure, a gate oxidation step is effected, leading to the formation of a thin oxide layer, followed by a step of deposition of a polycrystalline silicon layer and the doping thereof by phosphorus deposition. At this point an appropriate masking step is performed to define, in this polysilicon layer, the pattern of the gate electrodes of the transistors, obtaining a second intermediate structure, schematically shown in FIG. 2 and having, besides the previously indicated regions, the gate electrodes 6 and 7 of the two complementary transistors and the related gate insulations 6' and 7' thereof.

Two successive masking operations, performed in sequence, allow implantation, respectively in the initial substrate and in the zone with opposite type of conductivity, of the ions which are to form the source and drain electrodes of the two types of transistors and the substrate biasing regions. These two steps are schematically illustrated in FIGS. 3 and 4, wherein the reference numeral 8 indicates the first mask, for the implantation of ions which leads to the formation of the source and drain regions 9 of the transistor in the substrate and of the insulation region 9' in the zone, and 11 indicates the resist mask which allows the implantation of the opposite-type ions which lead to the formation of the source and drain regions 10 of the transistor formed in the zone and of the biasing region 10' in the substrate.

It is convenient, at this point, to explicitly point out that these ions do not penetrate below the gate electrodes. In other words, the latter screens against the implantation of the ions which are to constitute the source and drain electrodes of the transistors, which are therefore "self-aligned" with the gate regions. On the other hand, the masking layer is external to the previously defined active regions delimited by the field oxide (regions 5). This field oxide, due to its thickness, prevents the passage of the ions which are implanted. The source and the drain, therefore, are also "self-aligned" with the edge of the field oxide.

Once the diffusion of the source and drain regions has been performed in the substrate and in the opposite-type zone, the process continues with the deposition of the insulating layers, conveniently subjected to reflow by a thermal process, the opening of the contacts, the deposition of a metallic layer, the masking for the definition of the metallic interconnection paths, the deposition of the final passivation and the masking for the opening of the accesses to the external electric systems.

Consequently, for manufacturing a pair of complementary transistors, i.e. a CMOS device, according to the current process described above, ten masking steps are required, i.e.: (1) definition and implantation of the zone with opposite doping with respect to that of the substrate; (2) definition of the active areas; (3) definition and implantation of the insulation regions on the substrate; (4) definition and implantation of the insulation regions in the zone; (5) definition of the gate electrodes and the interconnections in the polycrystalline silicon; (6) definition and implantation of the source and drain regions of the transistor in the substrate; (7) definition and implantation of the source and drain region of the transistor in the zone; (8) definition of the contacts; (9) definition of the metallic interconnection paths; (10) definition of the openings in the passivation layer.

It should be stressed, with reference to the foregoing, that the masking steps are indeed the most expensive steps of the process of manufacturing an integrated circuit, and the need is accordingly felt to reduce the number of required masking steps, in order to reduce the production cost of CMOS devices and bring it nearer to the cost of NMOS devices.

SUMMARY OF THE INVENTION

Accordingly, the aim of the present invention is to provide a process for manufacturing CMOS devices with a reduced number of masking steps, reducing thus the production costs of devices in this technology.

Within this aim, a particular object of the present invention is to provide a process for manufacturing CMOS devices which comprises per se known and already-employed process steps, so as to allow the use of machines commonly used in the electronics industry.

Not least object of the present invention is to provide a process for manufacturing CMOS devices which provides devices having electric characteristics comparable to those of devices produced according to known processes.

The cited aim and objects, as well as others which will become apparent hereinafter are achieved by a process for manufacturing CMOS devices with a reduced number of masking steps, according to the invention, as defined in the accompanying claims.

BRIEF DESCRIPTION OF THE DRAWINGS

The characteristics and advantages of the invention will become apparent from the description of a preferred but not exclusive embodiment thereof, illustrated only by way of non-limitative example in the accompanying drawings, wherein.

DESCRIPTION OF THE PREFERRED EMBODIMENTS

Hereinafter only FIGS. 5 to 13 are described, reference being made, regarding FIGS. 1–4, to what has been previously described.

Figure 1:
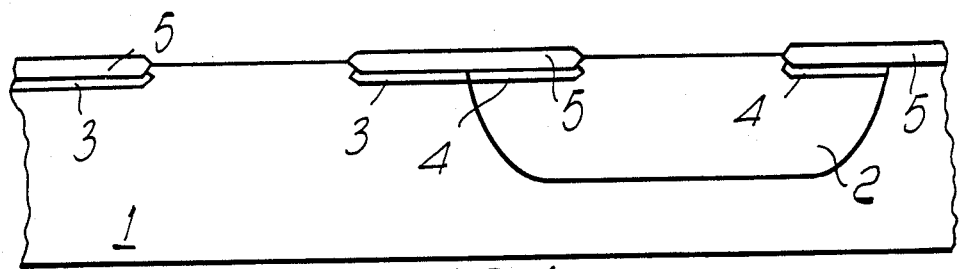
FIGS. 1 to 4 are transverse sectional views through a wafer of semiconductor material in four different steps of the known process.
Figure 2:
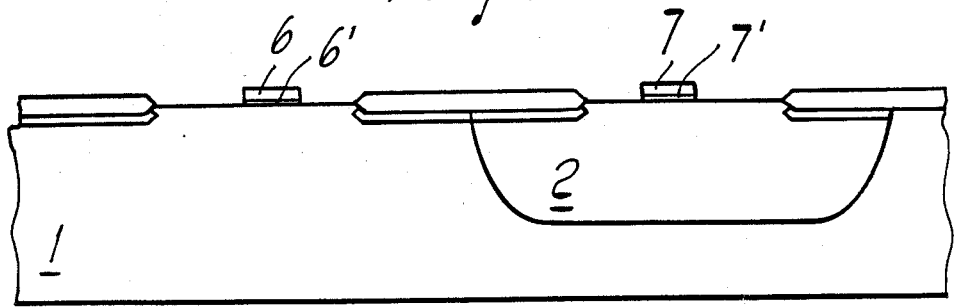
Figure 3:
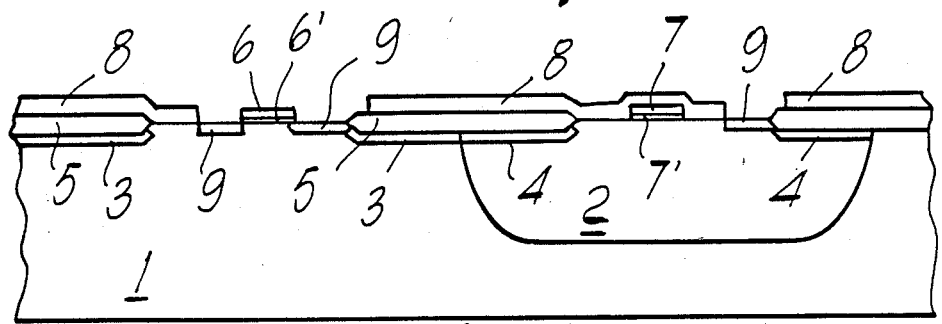
Figure 4:
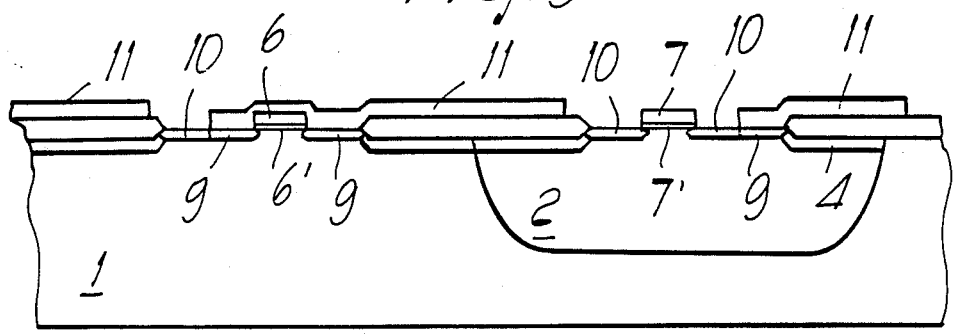
Figure 5:
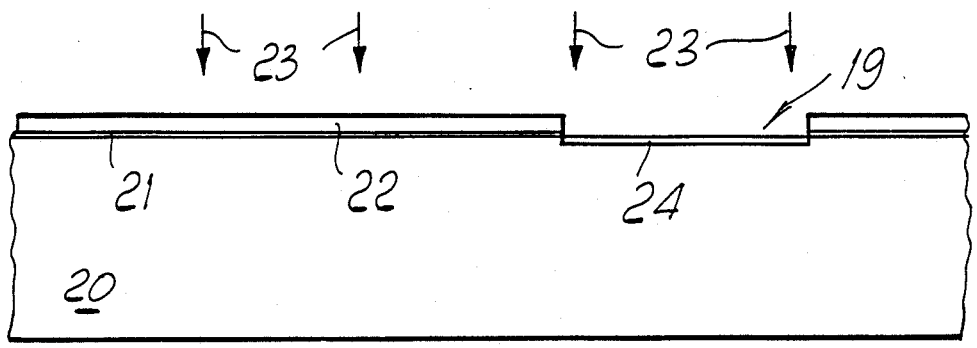
FIGS. 5 to 13 are similar transverse sectional views of a silicon wafer during different manufacturing steps according to the inventive process.

Reference should thus be made to FIG. 5, illustrating a transversely sectioned silicon wafer during one of the very first manufacturing steps. In particular the structure shown in FIG. 5 comprises a substrate 20 of a first type of conductivity, on which an inert (oxide) layer 21 has already been grown or deposited. A masking, performed with photolithographic methods on the layer 22 of photosensitive and subsequently removable material (photoresist), allows the obtainment of a mask 22 having a window 19 arranged facing the region of the substrate 20 in which the zone is to be produced. An ion-type implantation is effected on said structure (as indicated by the arrows 23) and leads, below the window 19, to the accumulation of ions in the thin layer 24. As is known, this ion-type is adapted to dope the semiconductor substrate in an opposite manner with respect to the pre-existing one, i.e. to cause the implanted region to have a second type of conductivity.

Figure 6:
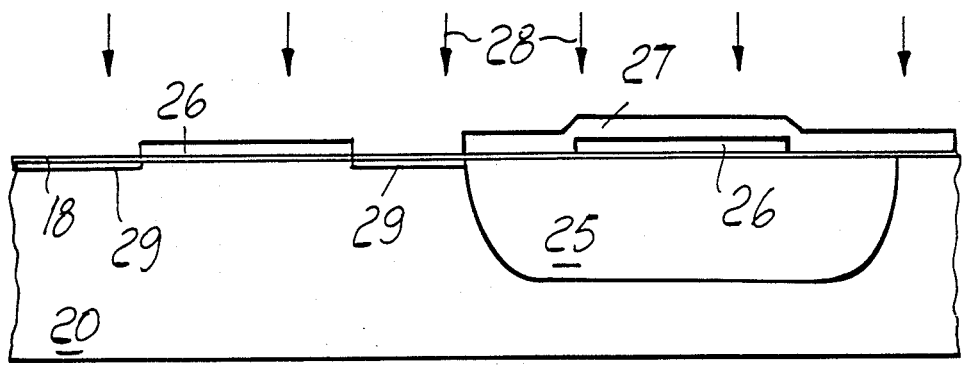

FIG. 6 illustrates a successive step of the process, after thermal diffusion of the ions implanted in the thin layer 24 until a zone 25 with appropriate conductivity is formed. An insulating (oxide) layer 18 has been grown on said structure. An inert (nitride) layer 26, having the property of being impermeable to oxidizing chemical material, has been deposited above said layer. By means of an appropriate mask (active-area mask), portions of the nitride layer 26 are removed, leaving it only in the regions shown in FIG. 6, above the active regions of the transistors. A layer of photosensitive and removable material 27 is deposited and, shaped by means of appropriate photolithographic methods, constitutes a mask for the implantation of ions adapted to define the insulation regions. This implantation is indicated in FIG. 6 by the arrows 28, and leads to the accumulation (in the thin layers 29) of ions adapted to increase the doping of the substrate 20, at least proximate to the surface.

Figure 7:
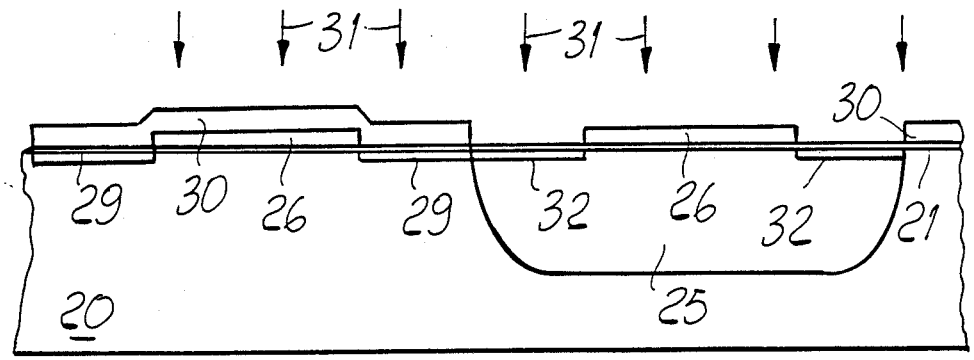

Once the mask formed by the layer 27 has been removed, the implantation of a further ion type is effected as shown in FIG. 7. In this figure one can observe the layer 30 of photosensitive and removable material (resist) defining a mask open on the zone. The arrows 31 indicate the implantation of ions, while the reference numeral 32 indicates the thin layers in which the implanted ions, adapted to increase the doping of the zone 25 at least proximate to the surface, accumulate.

Figure 8:
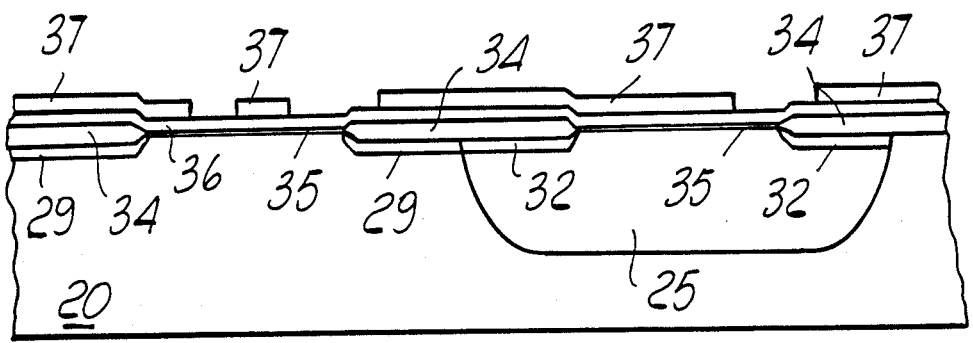

Upon removal of the resist layer 30, and by performing an appropriate thermal treatment in an oxidating environment (employing the masking constituted by the nitride portions 26 which prevents the growth of the insulating layer in the active regions which are to accommodate the transistors and, in general, all the elementary devices constituting the integrated circuit), the growth of the field oxide layer 34, shown in FIG. 8, is achieved, Once the nitride portions 26 and the portions of underlying oxide are removed, a gate oxidation step is performed, leading to the growth of a thin insulating layer (gate oxide 35) on the areas previously covered by the nitride 26, after which a polycrystalline silicon layer 36 is deposited and, according to the invention, the first of the two masks adapted to define the gate regions of the complementary transistors constituting a CMOS device is deposited. In particular, in the embodiment illustrated in the figures, a layer of photosensitive and removable material 37 is deposited and shaped with photolithographic methods so as to define windows superimposed on the regions of the substrate in which the source and drain regions of the transistor are to be formed. The mask 37 furthermore has a window at the zone 25, above the region thereof in which it is desired to produce a biasing region with a doping equal to that of the source and gate regions of the transistor in the substrate.

Figure 9:
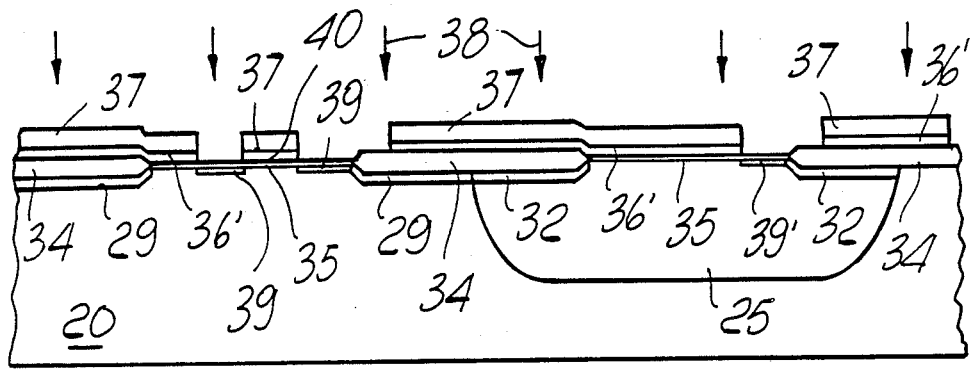

Subsequently, by employing the mask 37, a chemical etching of the uncovered portions of the polysilicon layer 36 is effected, thus defining only one of the two gate regions (i.e. the one related to the transistor which is formed in the substrate. The result of this step is shown in FIG. 9, wherein the reference numeral 36' indicates the remaining portions of the polysilicon layer, while the reference numeral 40 indicates the portion of the polysilicon layer which forms the gate region of the transistor in the substrate. By employing the same mask 37, the implantation of an ion type adapted to produce the source and gate regions of the same transistor in the substrate and the biasing region in the zone is then effected. The implantation, indicated by the arrows 38, leads to the accumulation of ions in the thin drain and source layers 39 and biasing layers 39', as illustrated in said FIG. 9.

Figure 10:
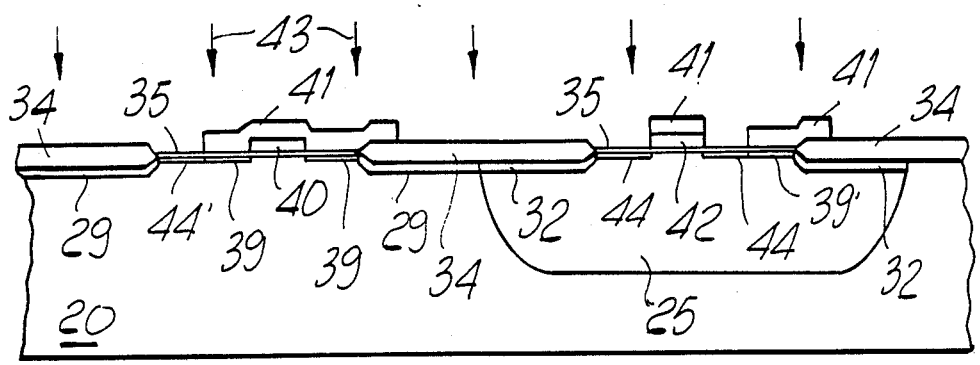

Once the mask 37 is removed, according to the invention a further mask is deposited for the definition of the gate region of the other elementary transistor to be formed in the zone 25. For this purpose a layer of photosensitive material is deposited on the preceding structure and is then shaped by means of photolithographic methods so as to define the mask 41 shown in FIG. 10. As can be seen, the mask 41 covers the source, drain and gate regions 39, 40 of the transistor produced in the substrate. The mask 41 furthermore covers the polysilicon layer 36' in the region in which the other gate region, related to the transistor formed in the zone, is to be produced, and also covers the thin biasing layer 39'. Then a chemical etching step is performed to remove the uncovered portions of the polysilicon layer 36', which is thus reduced to the gate region 40, defined by means of the preceding mask, and to the gate region 42, shaped by means of the mask 41. This same mask 41 is then used for the implantation of a further ion type adapted to appropriately dope the regions of the zone 25 and of the substrate which are to become the drain and source regions of the transistor in the zone 25 and the biasing regions in the substrate 20. This implantation is indicated in FIG. 10 by the arrows 43, and leads to the constitution of the thin layers 44 in the zone and 44' in the substrate, having opposite conductivity with respect to that of the zone 25.

Figure 11:
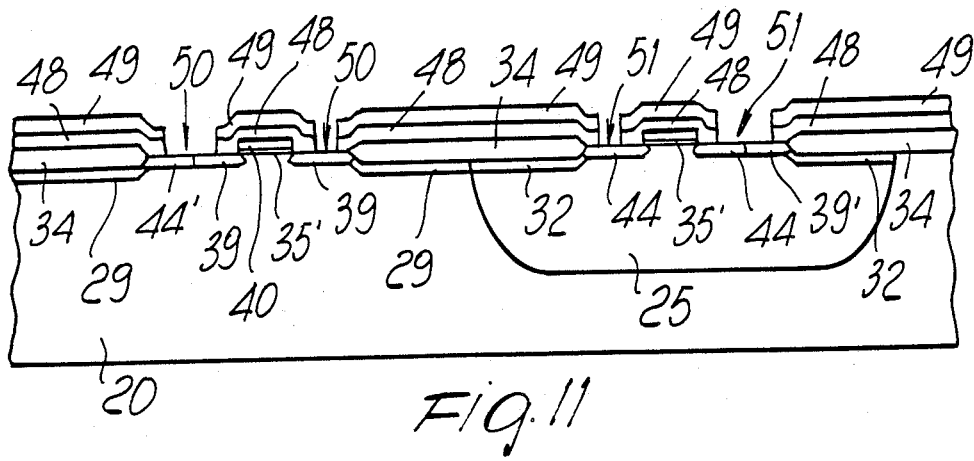

Once the mask 41 is removed, the process continues in a known manner with the deposition of an insulating layer 48, the manufacture of a mask 49 in photosensitive and insulating material and the definition of the contact regions 50 for the transistor in the substrate and 51 for the complementary transistor in the zone 25. The result of these operations is shown in FIG. 11.

Figure 12:
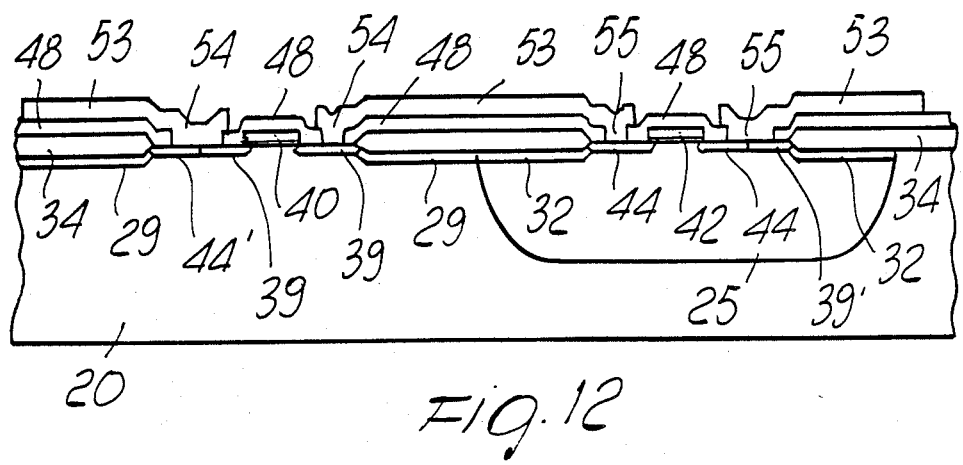
Figure 13:
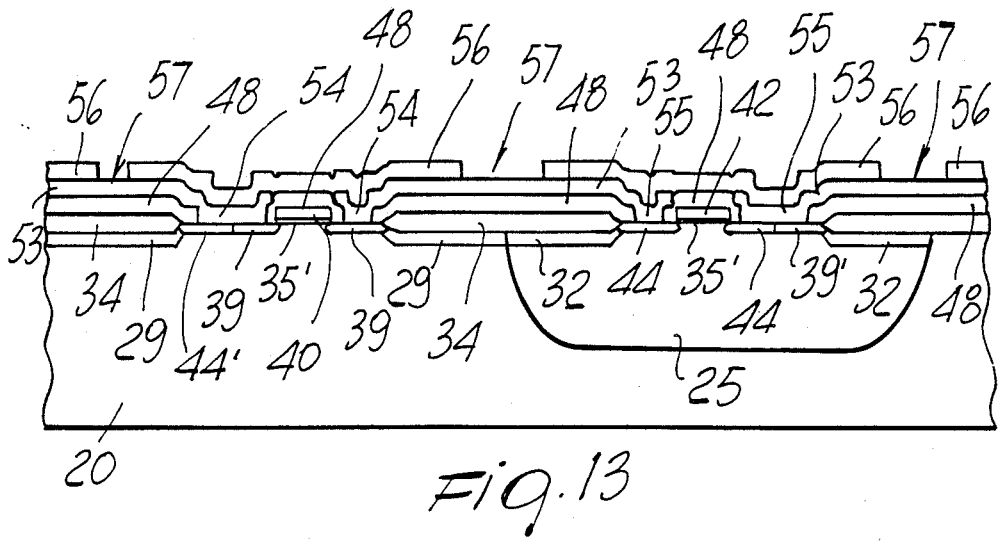

Then a metallic-type conductive layer, indicated at 53 in FIG. 12, is deposited and forms, at the previously defined contact regions, the contacts 54 and 55. This metallic layer 53 is shaped by means of an appropriate mask, not shown in the figure for the sake of simplicity, in a manner adapted to define the interconnection paths.

Finally a layer of passivation dielectric 56 is deposited (see FIG. 13) and is then shaped by means of an appropriate mask (not shown) for the production of the regions 57 of interconnection towards the external electric systems.

In practice, according to the invention, instead of implementing the gate regions of the transistors by means of a single masking step, provided specifically for this purpose, and thus use two further specific masks to perform the source and drain dopings of the two complementary transistors (i.e. using three masking steps for the definition of the source, drain and gate regions of the transistors), the invention provides the definition of the gate regions by means of two separate masks, each being adapted for the definition of a single gate region and also employed for the implantation of ions for the formation of the source and drain regions of the transistor the gate region whereof has just been defined. In this manner only two masks (and related masking operations) are sufficient for the production of the source, drain and gate regions of the transistors.

It should be noted that, according to the present invention, two steps of chemical etching of the polysilicon layer are required, However, since the chemical etching step has costs which are normally lower than those of a masking step, the costs for carrying out the process according to the invention are considerably lower than those incurred using known processes.

The division of the masking of the layer which forms the gate regions of the transistors into two steps may entail problems in the connecting regions, which problems can however be easily overcome by providing the connections at the widenings of the layer of the gate regions required for the location of the contacts of this layer.

The process according to the invention furthermore complicates the alignment of the successive maskings on the polysilicon layer. This problem can be overcome by allowing an increase of the alignment tolerances. This increase has no adverse indications, especially in the case of processes in which the tolerances are not strained to their maximum limit, in particular for the less recent processes, still currently in use and very relevant economically.

As can be seen from the preceding description, the invention fully achieves the proposed aims. A process for manufacturing CMOS devices has in fact been provided which allows to reduce the number of masking steps and therefore allows an appreciable reduction of production costs, though it is fully compatible with the current equipment existing in production departments: therefore it requires no specific investments which would reduce its economy.

The invention thus conceived is susceptible to numerous modifications and variations, all of which are within the scope of the inventive concept. In particular the fact is stressed that the process can be applied to diffrerent types of CMOS processes, with different steps before and after the definition of the gate, source and drain regions of the complementary transistors. The process is furthermore independent of the type of conductivity of the substrate and of the zone and also allows exchange of the two masking steps with respect to the illustrated example, so as to first provide the source, drain and gate regions of the transistor in the zone and then those of the transistor in the substrate, when this is advantageous.

Finally, all the details may be replaced with other technically equivalent elements.

I claim:

1. A process for manufacturing CMOS devices, comprising, for each CMOS device including a first and a second complementary MOS transistors having gate, drain and source regions, at least the steps of: forming, in a semiconductor substrate having a first conductivity type, an opposite conductivity zone; forming isolation regions in said substrate and in said opposite conductivity zone; forming an insulating material layer on said semiconductor substrate; depositing a semiconductor material layer above said insulating material layer; depositing first portions of photosensitive material above said semiconductor material layer at least at regions thereof adapted to form the gate regions of said first and second MOS transistors and at regions thereof overlying zones of said opposite conductivity zone adapted to form the source and drain regions of said second MOS transistor; shaping said semiconductor material layer to form the gate of said first transisotr; simultaneous and selective introduction of ions of a first type into said substrate for forming the drain and source regions of said first transistor and into said opposite conductivity zone for forming a biasing region; depositiing second portions of photosensitive material covering said semiconductor material layer at least at the gate of the first transistors, at regions of said semiconductor material layer adapted to form the gate regions of said second MOS transistor and at regions of said semiconductor material layer overlying the source and drain regions of said first MOS transistor; simultaneous and selective introduction of ions of a second type into said opposite conductivity zone for forming the drain and source regions of said second transistor adjacent to said biasing region and into said substrate for forming a further biasing region adjacent to said first transistor; depositing an insulating covering layer; and forming contacts, metallizations and passivations.

2. A process for manufacturing CMOS devices, comprising, for each CMOS device including a first and a second complementary MOS transistor having gate, drain and source regions, at least the steps of: forming, in a semiconductor substrate having a first conductivity type, an opposite conductivity zone; forming isolation regions in said substrate and in said opposite conductivity zone; forming an insulating material layer on said semiconductor substrate; depositing a semiconductor material layer above said insulating material layer; depositiing a first mask of photosensitive material above said semiconductor material layer, said first mask having first mask portions extending at least above regions of said semiconductor material layer adapted to form the gate regions of said first and second MOS transistors and above regions of said semiconductor material layer overlying zones of said opposite conductivity zone adapted to form the source and drain regions of said second MOS transistor, said first mask further defining first windows overlying at least one first and one second portions of said substrate and one first portion of said opposite conductivity zone; removing portions of said semiconductor material layer facing said first windows so as to shape the gate region of said first MOS transistor; simultaneously and selectively introducing ions of a first type into said susbstrate at said first and second portions thereof for forming the drain and source regions of said first transistor and into said opposite conductivity zone at said first portion thereof for forming a biasing region; removing said first mask; depositing a second mask of photosensitive material above said semiconductor material layer, said second mask having second mask portions covering at least the gate region of said first transistor, a region of said semiconductor material layer adapted to form the gate region of said second MOS transistor and regions of said semiconductor material layer overlying the source and drain regions of said first MOS transistor, said second mask defining second windows overlying one third portion of said substrate and one second and one third portions of said opposite conductivity zone; removing portions of said semiconductor material layer facing said second windows so as to shape the gate region of said second MOS transistor; simultaneously and selectively introducing ions of a second type into said opposite conductivity zone at said second and third portions thereof for forming the drain and source regions of said second transistor adjacent to said biasing region and into said substrate at said third portion thereof for forming a further biasing region adjacent to said first transistor; removing said second mask; depositing an insulating covering layer; and forming contacts, metallizations and passivations.

* * * * *